US009362347B2

(12) United States Patent
Yoon et al.

(10) Patent No.: US 9,362,347 B2
(45) Date of Patent: Jun. 7, 2016

(54) ORGANIC LIGHT-EMITTING DIODE (OLED) DISPLAY

(71) Applicant: Samsung Display Co., Ltd., Yongin, Gyeonggi-do (KR)

(72) Inventors: Ju-Won Yoon, Yongin (KR); Il-Jeong Lee, Yongin (KR); Choong-Youl Im, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/578,844

(22) Filed: Dec. 22, 2014

(65) Prior Publication Data

US 2015/0372070 A1 Dec. 24, 2015

(30) Foreign Application Priority Data

Jun. 23, 2014 (KR) ........................ 10-2014-0076633

(51) Int. Cl.
*H01L 27/32* (2006.01)
*H01L 51/50* (2006.01)
*H01L 51/52* (2006.01)

(52) U.S. Cl.
CPC ........ *H01L 27/3276* (2013.01); *H01L 27/3248* (2013.01); *H01L 27/3258* (2013.01); *H01L 27/3262* (2013.01); *H01L 27/3265* (2013.01); *H01L 51/5012* (2013.01); *H01L 51/5206* (2013.01); *H01L 51/5221* (2013.01)

(58) Field of Classification Search
CPC ............ H01L 27/3276; H01L 27/3258; H01L 27/3248; H01L 27/3262; H01L 27/3265; H01L 51/5206; H01L 51/5221; H01L 51/5012

USPC ................. 257/40, 59, 65, 88, 211, E29.003, 257/E29.117, E29.273, E27.111, E51.018, 257/E21.09; 365/117, 189.15; 438/23, 29, 438/151, 157, 488
See application file for complete search history.

(56) References Cited

U.S. PATENT DOCUMENTS

| | | | |
|---|---|---|---|
| 7,576,821 B2 | 8/2009 | Lee et al. | |
| 8,692,453 B2 | 4/2014 | Im et al. | |
| 8,975,630 B2* | 3/2015 | Yoon et al. | 257/59 |
| 2010/0182303 A1 | 7/2010 | Takasugi et al. | |
| 2010/0182552 A1* | 7/2010 | Park et al. | 349/114 |
| 2011/0248276 A1* | 10/2011 | Son et al. | 257/65 |
| 2011/0272714 A1* | 11/2011 | Lhee | 257/88 |
| 2012/0075270 A1* | 3/2012 | Kitakado | 345/204 |
| 2012/0097927 A1* | 4/2012 | Shin | 257/40 |
| 2014/0034923 A1 | 2/2014 | Kim et al. | |

FOREIGN PATENT DOCUMENTS

| | | |
|---|---|---|
| JP | 2001-235765 A | 8/2001 |
| KR | 10-2002-0005899 A | 1/2002 |
| KR | 10-0659765 B1 | 12/2006 |
| KR | 10-2010-0013320 A | 2/2010 |
| KR | 10-2014-0018623 A | 2/2014 |

* cited by examiner

*Primary Examiner* — Dao H Nguyen
(74) *Attorney, Agent, or Firm* — Knobbe, Martens, Olson & Bear, LLP

(57) ABSTRACT

An organic light-emitting diode (OLED) display is disclosed. In one aspect, the OLED display includes a plurality of pixels. Each of the pixels includes a first insulating layer and first and second signal lines spaced apart from each other. At least a portion of the first and second signal lines is formed over the first insulating layer. Each pixel also includes a second insulating layer interposed between the first and second signal lines. The second insulating layer has a lower permittivity that the first insulating layer.

18 Claims, 9 Drawing Sheets

ORGANIC LIGHT-EMITTING DIODE (OLED) DISPLAY

INCORPORATION BY REFERENCE TO ANY PRIORITY APPLICATIONS

This application claims the benefit of Korean Patent Application No. 10-2014-0076633, filed on Jun. 23, 2014, in the Korean Intellectual Property Office, the disclosure of which is incorporated herein in its entirety by reference.

BACKGROUND

1. Field

The described technology generally relates to an organic light-emitting diode (OLED) display.

2. Description of the Related Technology

OLED displays include a plurality of OLEDs that generate light through the recombination of electrons and holes. OLED displays have advantages over traditional displays which include fast response speeds and low power consumption.

When driven with an active matrix driving scheme, OLED displays include a plurality of gate lines, a plurality of data lines, a plurality of power lines, and a plurality of pixels that are connected to the above-described lines and are arranged in a matrix. These signal lines transmit various signals to each pixel in order to individually drive the pixels. When these signal lines are arranged near each other in, for example, a high resolution display, signal interference may occur between the signal lines.

SUMMARY OF CERTAIN INVENTIVE ASPECTS

Various inventive aspects call for an OLED display in which interference between signals transmitted to pixels is reduced.

Another aspect is an OLED display including a first line transmitting a signal to each pixel; and a second line that is separate from the first line and formed on the same layer as the first line. Lower areas of the first and second lines include a first insulating layer formed below at least one of the first and second lines and a second insulating layer that is formed on an area between the first and second lines and has a lower permittivity than the first insulating layer.

The first insulating layer may be formed of an inorganic material and the second insulating layer may be formed of an organic material.

A planarization layer that covers the first and second lines and is formed of the same material as the second insulating layer may be further included.

An etch stop layer that is formed on the lower area of the second insulating layer and has an etching rate that is different from an etching rate of the first insulating layer may be further included.

Each pixel may further include a driving thin film transistor (TFT) provided on a substrate. The first line may be a data line transmitting a data signal to each pixel and the second line may be a contact metal connected to the driving TFT via a contact hole.

The first line may overlap at least a portion of the driving TFT, with the first insulating layer between the first line and the driving TFT.

A storage capacitor, which includes a first electrode connected to a driving gate electrode of the driving TFT and a second electrode provided on and insulated from the first electrode, may be further included. The driving gate electrode and the first electrode may be integrally formed on the same layer.

The driving TFT may include a driving semiconductor layer provided under the driving gate electrode and insulated by a first gate insulating layer.

The storage capacitor may include a second gate insulating layer provided between the first and second electrodes.

The second electrode may be connected to a driving voltage line transmitting a driving voltage that operates an OLED.

An emission control TFT that is formed between the driving TFT and an OLED and includes an emission control semiconductor layer provided on the same layer as the driving semiconductor layer, and an emission control gate electrode insulated from the emission control semiconductor layer by the first gate insulating layer that covers the emission control semiconductor layer, may be further included.

The OLED may include an anode electrode, a cathode electrode opposite to the anode electrode, and an organic emission layer formed between the anode and cathode electrodes.

Another aspect is an OLED display including a driving thin film transistor (TFT) provided on a substrate; an interlayer insulating layer covering the driving TFT; a contact metal formed on the interlayer insulating layer and connected to the driving TFT via a contact hole; and a first line formed on the interlayer insulating layer and that overlaps at least a portion of the driving TFT. The interlayer insulating layer includes a first insulating layer formed under an area of the contact metal and the first line, and a second insulating layer formed under an area between the contact metal and the first line and has a lower permittivity than the first insulating layer.

The first insulating layer may be formed of an inorganic material, and the second insulating layer may be formed of an organic material.

A planarization layer that covers the contact metal and the first line and is formed of the same material as the second insulating layer may be further included.

An etch stop layer that is formed under the second insulating layer and has an etching rate that is different from an etching rate of the first insulating layer may be further included.

A storage capacitor, which includes a first electrode connected to a driving gate electrode of the driving TFT and a second electrode provided on and insulated from the first electrode, may be further included. The driving gate electrode and the first electrode may be integrally formed on the same layer.

The driving TFT may include a driving semiconductor layer provided under the driving gate electrode and insulated by a first gate insulating layer. The storage capacitor may include a second gate insulating layer provided between the first and second electrodes. The thickness of the first gate insulating layer may be greater than the thickness of the second gate insulating layer.

Another aspect is an OLED display comprising a plurality of pixels, wherein each of the pixels comprises: a first insulating layer; a first signal line configured to transmit a first signal to the pixel; a second signal line spaced apart from the first signal line and formed on the same layer as the first signal line, wherein the second signal line is configured to transmit a second signal to the pixel and wherein at least a portion of the first and second signal lines is formed over the first insulating layer; and a second insulating layer interposed between the first and second signal lines, wherein the second insulating layer has a lower permittivity that the first insulating layer.

In exemplary embodiments, the first insulating layer is formed of an inorganic material and the second insulating layer is formed of an organic material. Each pixel can further comprise a planarization layer covering the first and second signal lines and formed of the same material as the second insulating layer. Each pixel can further comprise an etch stop layer formed below the second insulating layer and the etch stop layer can have an etching rate that is different from that of the first insulating layer. The OLED display can further comprise a substrate, wherein each pixel further comprises a driving thin film transistor (TFT) formed over the substrate, wherein the first signal line is a data line configured to transmit a data signal to the pixel, and wherein the second signal line is a contact metal electrically connected to the driving TFT via a contact hole. The first signal line can overlap at least a portion of the driving TFT and the first insulating layer can be interposed between the first signal line and the driving TFT.

In exemplary embodiments, each pixel further comprises a storage capacitor including i) a first electrode connected to a driving gate electrode of the driving TFT and ii) a second electrode formed over and insulated from the first electrode and wherein the driving gate electrode and the first electrode are integrally formed on the same layer. Each of the driving TFTs can comprise a driving semiconductor layer formed below the driving gate electrode and insulated from the driving gate electrode by a first gate insulating layer. Each of the storage capacitors can comprise a second gate insulating layer interposed between the first and second electrodes. The second electrode of each of the storage capacitors can be electrically connected to a driving voltage line configured to transmit a driving voltage. Each of the pixels can further comprise an emission control TFT electrically connected between the driving TFT and an OLED, wherein the emission control TFT comprises i) an emission control semiconductor layer formed on the same layer as the driving semiconductor layer and ii) an emission control gate electrode insulated from the emission control semiconductor layer by the first gate insulating layer. The OLED can comprise i) an anode electrode, ii) a cathode electrode opposing the anode electrode, and iii) an organic emission layer interposed between the anode and cathode electrodes.

Another aspect is an OLED display comprising a substrate; and a plurality of pixels, wherein each of the pixels comprises: a driving thin film transistor (TFT) formed over the substrate; an interlayer insulating layer covering the driving TFT; a contact metal formed over the interlayer insulating layer and electrically connected to the driving TFT via a contact hole; and a first signal line formed over the interlayer insulating layer and overlapping at least a portion of the driving TFT, wherein the interlayer insulating layer comprises i) a first insulating layer formed below the contact metal and the first signal line and ii) a second insulating layer interposed between the contact metal and the first signal line, wherein the second insulating layer has a lower permittivity than the first insulating layer.

In exemplary embodiments, the first insulating layer is formed of an inorganic material and wherein the second insulating layer is formed of an organic material. Each pixel can further comprise a planarization layer covering the contact metal and the first signal line and formed of the same material as the second insulating layer. Each pixel can further comprise an etch stop layer formed below the second insulating layer and the etch stop layer can have an etching rate that is different from that of the first insulating layer. Each pixel can further comprise a storage capacitor including i) a first electrode connected to a driving gate electrode of the driving TFT and ii) a second electrode formed over and insulated from the first electrode and the driving gate electrode and the first electrode can be integrally formed on the same layer. Each of the driving TFTs can comprise a driving semiconductor layer formed below the driving gate electrode and insulated from the driving gate electrode by a first gate insulating layer, the storage capacitor can comprise a second gate insulating layer interposed between the first and second electrodes, and the thickness of the first gate insulating layer can be greater than the thickness of the second gate insulating layer.

DETAILED DESCRIPTION OF CERTAIN INVENTIVE EMBODIMENTS

Figure 1:
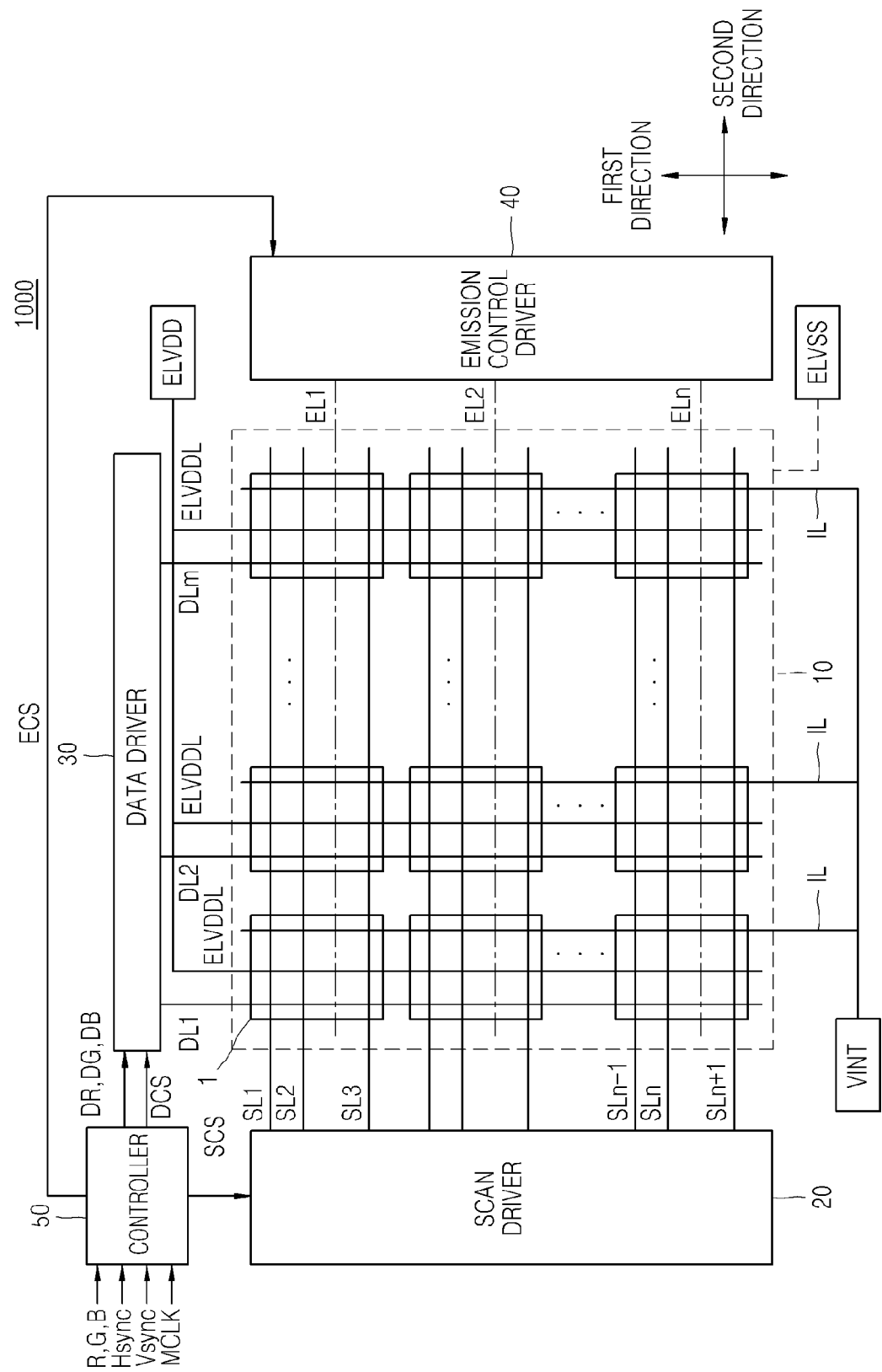
FIG. 1 is a schematic block diagram of an OLED display according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when a layer, region, or component is referred to as being "formed on," another layer, region, or component, it can be directly or indirectly formed on the other layer, region, or component. That is, for example, intervening layers, regions, or components may be present.

The sizes of elements in the drawings may be exaggerated for the sake of clarity. In other words, since the sizes and thicknesses of components in the drawings may be exaggerated, the following embodiments are not limited thereto.

FIG. 1 is a schematic block diagram of an organic light-emitting diode (OLED) display 1000 according to an embodiment.

The OLED display 1000 includes a display unit or display panel 10 that includes a plurality of pixels 1. The OLED display 1000 further includes a scan driver 20, a data driver 30, an emission control driver 40, and a controller 50.

The display unit 10 is located at the intersections between a plurality of scan lines SL1 to SLn+1, a plurality of data lines DL1 to DLm, and a plurality of emission control lines EL1 to ELn. The display unit 10 includes the pixels 1 and the pixels 1 are arranged in a matrix. The scan lines SL1 to SLn+1 and the emission control lines EL1 to ELn extend in a second direction, i.e., a row direction and the data lines DL1 to DLm and driving voltage lines ELVDDL extend in a first direction, i.e., a column direction. In each pixel line, the n-value of the scan lines SL1 to SLn+1 may differ from the n-value of the emission control lines EL1 to ELn.

Each pixel 1 is connected to three scan lines SL1 to SLn+1 that extend across the display unit 10. The scan driver 20 transmits three scan signals to each pixel 1 via the scan lines SL1 to SLn+1. That is, the scan driver 20 sequentially supplies scan signals via first scan lines SL2 to SLn, second scan lines SL1 to SLn-1, or third scan lines SL3 to SLn+1.

Initialization voltage lines IL receive an initialization voltage for initializing the display unit 10 from an external power supply source VINT.

Also, each pixel 1 is connected to one of the data lines DL1 to DLm that extend across the display unit 10 and one of the emission control lines EL1 to ELn that extend across the display unit 10.

The data driver 30 transmits data signals to the pixels 1 via the data lines DL1 to DLm. The data signals are supplied to a pixel selected by a scan signal whenever the scan signals are supplied via the first scan lines SL2 to SLn.

The emission control driver 40 generates and transmits emission control signals to the pixels 1 via the emission control lines EL1 to ELn. The emission control signals control the emission time of the pixels 1. According to the embodiment, the emission control driver 40 may be omitted depending on the internal structure of the pixels 1.

The controller 50 converts a plurality of image signals R, G, and B that are received from an external source into a plurality of image data signals DR, DG, and DB and transmits the image data signals DR, DG, and DB to the data driver 30. The controller 50 also receives vertical synchronization signals Vsync, horizontal synchronization signals Hsync, and clock signals MCLK and generates and transmits control signals for controlling the operations of the scan driver 20, the data driver 30, and the emission control driver 40. That is, the controller 50 generates scan driver control signals SCS for controlling the scan driver 20, data driver control signals DCS for controlling the data driver 30, and emission driver control signals ECS for controlling the emission control driver 40 and transmits each signal to its corresponding driver.

Each of the pixels 1 receives a first power voltage ELVDD and a second power voltage ELVSS. In some embodiments, the first power voltage ELVDD is a predetermined high level voltage and the second power voltage ELVSS is a voltage that is lower than the first power voltage ELVDD or a ground voltage. The first power voltage ELVDD is provided to the pixels 1 via the driving voltage lines ELVDDL.

Each of the pixels 1 emits light having a predetermined brightness in response to a driving current that is supplied to an OLED of the pixel 1. The driving currents are generated based on the data signals transmitted via the data lines DL1 to DLm.

Figure 2:
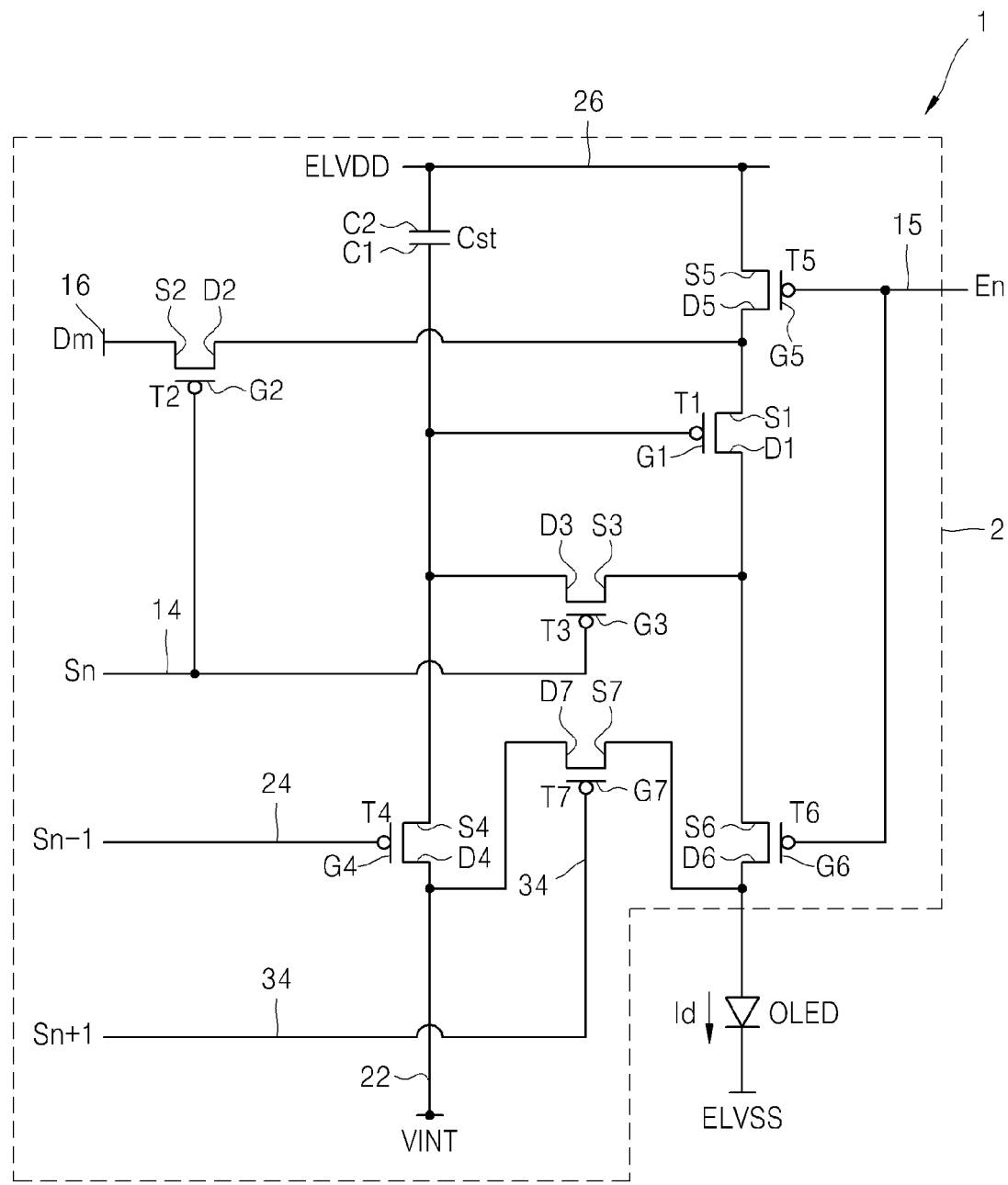
FIG. 2 is an equivalent circuit diagram of a pixel of the OLED display according to an embodiment.

FIG. 2 is an equivalent circuit diagram of an exemplary pixel 1 of the OLED display 1000 according to an embodiment.

The pixel 1 includes a pixel circuit 2 that includes a plurality of thin film transistors (TFTs) T1 to T7 and at least one storage capacitor Cst. The pixel 1 also includes an OLED that receives a driving current Id via the pixel circuit 2 and thus emits light.

The TFTs include a driving TFT T1, switching TFT T2, compensation TFT T3, a first initialization TFT T4, a first emission control TFT T5, a second emission control TFT T6, and a second initialization TFT T7.

The pixel 1 includes a first scan line 14 that transmits a first scan signal Sn to the switching TFT T2 and the compensation TFT T3, a second scan line 24 that transmits a second scan signal Sn-1 to the first initialization TFT T4, and a third scan line 34 that transmits a third scan signal Sn+1 to the second initialization TFT T7. The pixel 1 further includes an emission control line 15 that transmits an emission control signal En to the first and second emission control TFTs T5 and T6, a data line 16 that transmits a data signal Dm, a driving voltage line 26 that transmits the first power voltage ELVDD, and an initialization voltage line 22 that transmits an initialization voltage VINT for initializing the driving TFT T1.

A driving gate electrode G1 of the driving TFT T1 is connected to a first electrode C1 of the storage capacitor Cst. A driving source electrode S1 of the driving TFT T1 is connected to the driving voltage line 26 via the first emission control TFT T5. A driving drain electrode D1 of the driving TFT T1 is electrically connected to an anode electrode of the OLED via the second emission control TFT T6. The driving TFT T1 receives the data signal Dm based on the switching operation of the switching TFT T2 and supplies the driving current Id to the OLED.

A switching gate electrode G2 of the switching TFT T2 is connected to the first scan line 14. A switching source electrode S2 of the switching TFT T2 is connected to the data line 16. A switching drain electrode D2 of the switching TFT T2 is connected to the driving source electrode S1 of the driving TFT T1 and to the driving voltage line 26 via the first emission control TFT T5. The switching TFT T2 is turned on according to the first scan signal Sn received via the first scan line 14 and performs a switching operation in which the data signal Dm received via the data line 16 is transmitted to the driving source electrode S1 of the driving TFT T1.

A compensation gate electrode G3 of the compensation TFT T3 is connected to the first scan line 14. A compensation source electrode S3 of the compensation TFT T3 is connected to the driving drain electrode D1 of the driving TFT T1 and to the anode electrode of the OLED via the second emission control TFT T6. A compensation drain electrode D3 of the compensation TFT T3 is connected to the first electrode C1 of the storage capacitor Cst, a first initialization source electrode S4 of the first initialization TFT T4, and the driving gate electrode G1 of the driving TFT T1. The compensation TFT T3 is turned on according to the first scan signal Sn received via the first scan line 14 and connects the driving gate electrode G1 and the driving drain electrode D1 of the driving TFT T1. Thus, the driving TFT T1 forms a diode-connection based on the first scan signal Sn.

A first initialization gate electrode G4 of the first initialization TFT T4 is connected to the second scan line 24. A first initialization drain electrode D4 of the first initialization TFT T4 is connected to the initialization voltage line 22. The first initialization source electrode S4 of the first initialization TFT T4 is connected to the first electrode C1 of the storage capacitor Cst, the compensation drain electrode D3 of the compensation TFT T3, and the driving gate electrode G1 of the driving TFT T1. The first initialization TFT T4 is turned on based on the second scan signal Sn-1 received via the second scan line 24 and performs an initialization operation in which the initialization voltage VINT is transmitted to the driving gate electrode G1 of the driving TFT T1 and thus initializes the voltage of the driving gate electrode G1 of the driving TFT T1.

A first emission control gate electrode G5 of the first emission control TFT T5 is connected to the emission control line 15. A first emission control source electrode S5 of the first emission control TFT T5 is connected to the driving voltage line 26. A first emission control drain electrode D5 of the first emission control TFT T5 is connected to the driving source electrode S1 of the driving TFT T1 and the switching drain electrode D2 of the switching TFT T2.

A second emission control gate electrode G6 of the second emission control TFT T6 is connected to the emission control line 15. A second emission control source electrode S6 of the second emission control TFT T6 is connected to the driving drain electrode D1 of the driving TFT T1 and the compensation source electrode S3 of the compensation TFT T3. A second emission control drain electrode D6 of the second emission control TFT T6 is electrically connected to the anode electrode of the OLED. The first and second emission control TFTs T5 and T6 are substantially simultaneously turned on based on the emission control signal En received via the emission control line 15. Then, the first power voltage ELVDD is transmitted to the OLED and thus the driving current Id flows to the OLED.

A second initialization gate electrode G7 of the second initialization TFT T7 is connected to the third scan line 34. A second initialization source electrode S7 of the second initialization TFT T7 is connected to the anode electrode of the OLED. A second initialization drain electrode D7 of the second initialization TFT T7 is connected to the initialization voltage line 22. The second initialization TFT T7 is turned on based on the third scan signal Sn+1 received via the third scan line 34 and initializes the anode electrode of the OLED.

A second electrode C2 of the storage capacitor Cst is connected to the driving voltage line 26. The first electrode C1 of the storage capacitor Cst is connected to the driving gate electrode G1 of the driving TFT T1, the compensation drain electrode D3 of the compensation TFT T3, and the first initialization source electrode S4 of the first initialization TFT T4.

The second power voltage ELVSS is applied to a cathode electrode of the OLED. The OLED displays an image by receiving the driving current Id from the driving TFT T1 and thus emitting light.

Figure 3:
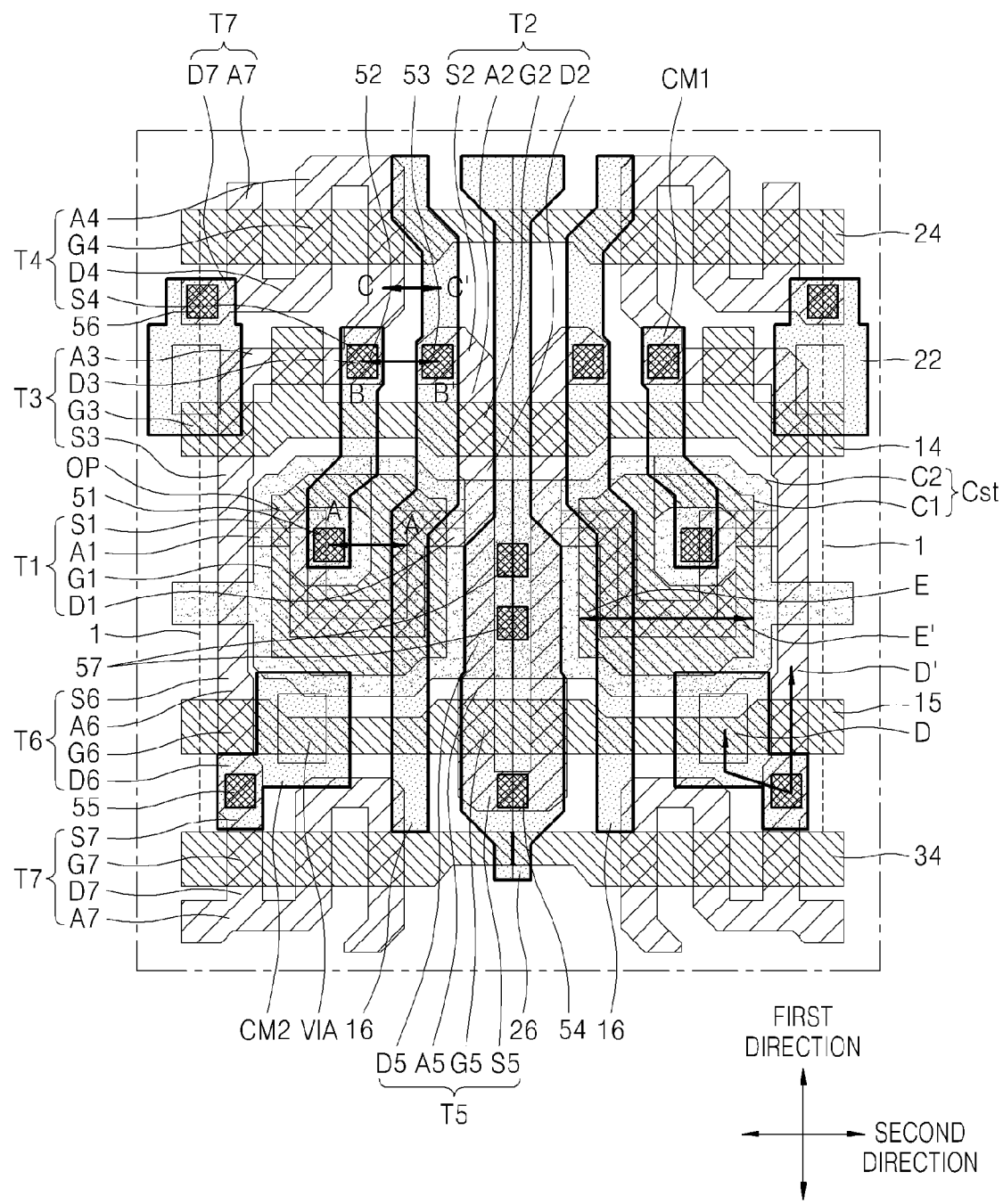
FIG. 3 is a schematic plan view of a pixel according to an embodiment.

FIG. 3 is a schematic plan view of the pixel 1 of the OLED display 1000 according to an embodiment. FIG. 3 illustrates two pixels 1 that are adjacent to each other (hereinafter referred to as "two adjacent pixels 1").

Referring to FIG. 3, the pixel 1 includes the driving TFT T1, the switching TFT T2, the compensation TFT T3, the first initialization TFT T4, the first emission control TFT T5, the second emission control TFT T6, the second initialization TFT T7, and the storage capacitor Cst. The OLED is omitted from the illustration of FIG. 3.

The driving TFT T1 includes a driving semiconductor layer A1, the driving gate electrode G1, the driving source electrode S1, and the driving drain electrode D1. The driving source electrode S1 is a driving source area in the driving semiconductor layer A1 which is doped with impurities and the driving drain electrode D1 is a driving drain area of the driving semiconductor layer A1 which is doped with impurities. The driving gate electrode G1 is connected to the first electrode C1 of the storage capacitor Cst, the compensation drain electrode D3 of the compensation TFT T3, and the first initialization source electrode S4 of the first initialization TFT T4. In detail, the driving gate electrode G1 and the first electrode C1 are integrally formed on an identical layer. The driving gate electrode G1, the compensation drain electrode D3, and the first initialization source electrode S4 are connected to a first contact metal CM1 formed in a first contact hole 51 and a second contact hole 52.

The switching TFT T2 includes a switching semiconductor layer A2, the switching gate electrode G2, the switching source electrode S2, and the switching drain electrode D2.

The switching source electrode S2 is a switching source area in the switching semiconductor layer A2 which is doped with impurities and the switching drain electrode D2 is a switching drain area in the switching semiconductor layer A2 which is doped with impurities. The switching source electrode S2 is connected to the data line 16 via a third contact hole 53. The switching drain electrode D2 is connected to the driving TFT T1 and the first emission control TFT T5. The switching gate electrode G2 is formed as a portion of the first scan line 14.

The compensation TFT T3 includes a compensation semiconductor layer A3, the compensation gate electrode G3, the compensation source electrode S3, and the compensation drain electrode D3. The compensation source electrode S3 is a compensation source area in the compensation semiconductor layer A3 which is doped with impurities and the compensation drain electrode D3 is a compensation drain area in the compensation semiconductor layer A3 which is doped with impurities. The compensation gate electrode G3 prevent leakage currents due to its dual gate electrode structure formed by a portion of the first scan line 14 and a portion protruding from the first scan line 14.

The first initialization TFT T4 includes a first initialization semiconductor layer A4, the first initialization gate electrode G4, the first initialization source electrode S4, and the first initialization drain electrode D4. The first initialization source electrode S4 is a first initialization source area in the first initialization semiconductor layer A4 which is doped with impurities and the first initialization drain electrode D4 is a first initialization drain area in the first initialization semiconductor layer A4 which is doped with impurities. The first initialization drain electrode D4 is connected to the second initialization TFT T7 and the first initialization source electrode S4 is connected to the driving gate electrode G1 and the first electrode C1 of the storage capacitor Cst via the first and second contact holes 51 and 52 in which the first contact metal CM1 is formed. The first initialization gate electrode G4 is formed as a portion of the second scan line 24. A dual gate electrode structure is formed by overlapping the first initialization semiconductor layer A4 with the first initialization gate electrode G4 twice.

The first emission control TFT T5 includes a first emission control semiconductor layer A5, the first emission control gate electrode G5, the first emission control source electrode S5, and the first emission control drain electrode D5. The first emission control source electrode S5 is a first emission control source area in the first emission control semiconductor layer A5 which is doped with impurities and the first emission control drain electrode D5 is a first emission control drain area in the first emission control semiconductor layer A5 which is doped with impurities. The first emission control source electrode S5 is connected to the driving voltage line 26 via a fourth contact hole 54. The first emission control gate electrode G5 is formed as a portion of the emission control line 15.

The second emission control TFT T6 includes a second emission control semiconductor layer A6, the second emission control gate electrode G6, the second emission control source electrode S6, and the second emission control drain electrode D6. The second emission control source electrode S6 is a second emission control source area in the second emission control semiconductor layer A6 which is doped with impurities and the second emission control drain electrode D6 is a second emission control drain area in the second emission control semiconductor layer A6 which is doped with impurities. The second emission control drain electrode D6 is connected to the anode electrode of the OLED via a second contact metal CM2 connected through a fifth contact hole 55 and a via hole VIA. The second emission control gate electrode G6 is formed as portion of the emission control line 15.

The second initialization TFT T7 includes a second initialization semiconductor layer A7, the second initialization gate electrode G7, the second initialization source electrode S7, and the second initialization drain electrode D7. The second initialization source electrode S7 is a second initialization source area in the second initialization semiconductor layer A7 which is doped with impurities and the second initialization drain electrode D7 is a second initialization drain area in the second initialization semiconductor layer A7 which is doped with impurities. The second initialization source electrode S7 is connected to the initialization voltage line 22 via a sixth contact hole 56. The second initialization drain electrode D7 is connected to the anode electrode of the OLED via the second contact metal CM2 connected through the fifth contact hole 55 and the via hole VIA. The second initialization gate electrode G7 is formed as a portion of the third scan line 34.

The first electrode C1 of the storage capacitor Cst is directly connected to the driving gate electrode G1 and connected to the compensation TFT T3 and the first initialization TFT T4 via the first contact metal CM1 formed in the first and second contact holes 51 and 52. In some embodiments, the first electrode C1 has a floating electrode structure and overlaps the driving semiconductor layer A1.

Although the second electrode C2 of the storage capacitor Cst overlaps the first electrode C1, the second electrode C2 does not completely cover the first electrode C1. The second electrode C2 includes an opening OP that exposes a portion of the first electrode C1 and the first electrode C1 and the first contact metal CM1 are connected via the opening OP. The second electrodes C2 that are formed in the two adjacent pixels 1 are connected to each other. The driving voltage line 26 is connected to a central portion of the second electrodes C2 that are commonly formed between the two adjacent pixels 1 via a seventh contact hole 57 and thus substantially simultaneously transmits the first power voltage ELVDD to the two adjacent pixels 1. That is, the two adjacent pixels 1 receive the first power voltage ELVDD from a single driving voltage line 26 by using the second electrode C2 that is commonly formed in the two adjacent pixels 1.

The first to third scan lines 14, 24, and 34 and the emission control line 15 are all formed on the same layer and extend in the second direction. The first to third scan lines 14, 24, and 34 and the emission control line 15 are formed on the same layer as the first electrode C1 of the storage capacitor Cst.

The data line 16, the driving voltage line 26, and the initialization voltage line 22 are all formed on the same layer and extend in the first direction.

The two adjacent pixels 1 share the driving voltage line 26. In detail, the driving voltage line 26 is formed between the two adjacent pixels 1 and extends in the first direction. The driving voltage line 26 is connected to the first emission control TFT T5, which is included in each of the two adjacent pixels 1, via the fourth contact hole 54, and to the second electrodes C2 of the storage capacitor Cst, which are commonly included in the two adjacent pixels 1, via the seventh contact hole 57. According to some embodiments, since the two adjacent pixels 1 share the driving voltage line 26, the two adjacent pixels 1 form a symmetrical structure with respect to the driving voltage line 26. Accordingly, the number of driving voltage lines 26 can be reduced, and thus, more design space is obtained due to the reduction in the number of lines.

Figure 4A:
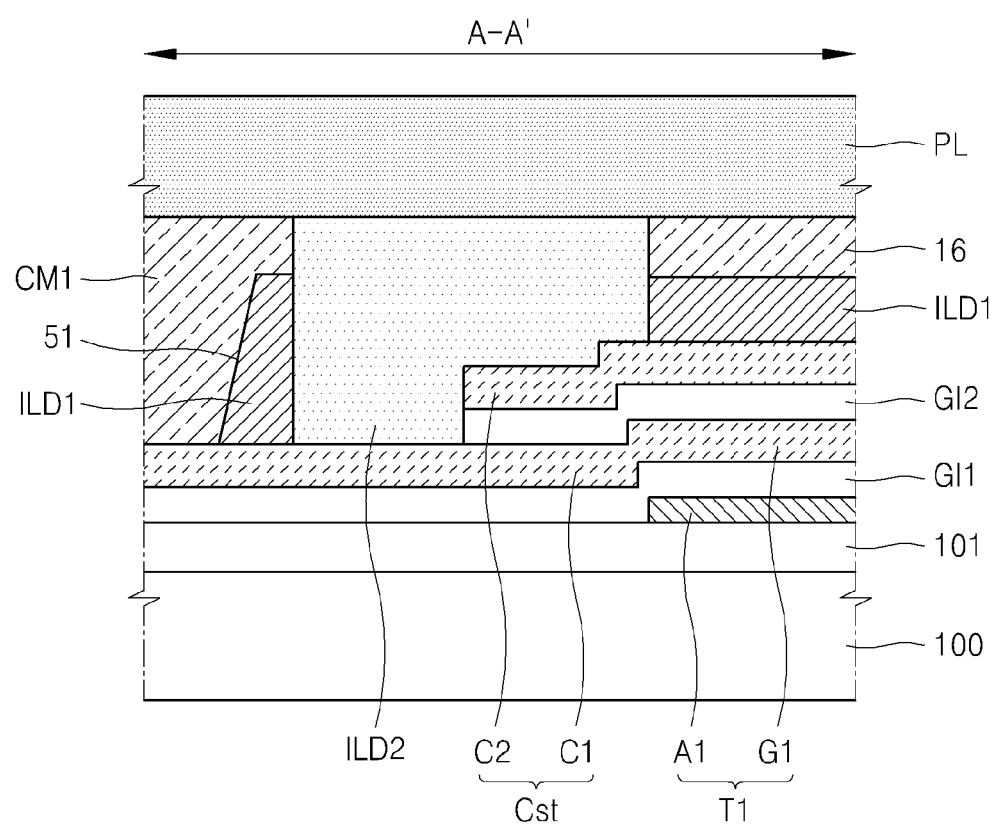
FIGS. 4A to 4C are cross-sectional views taken along lines A-A', B-B', and C-C' of FIG. 3.
Figure 4B:
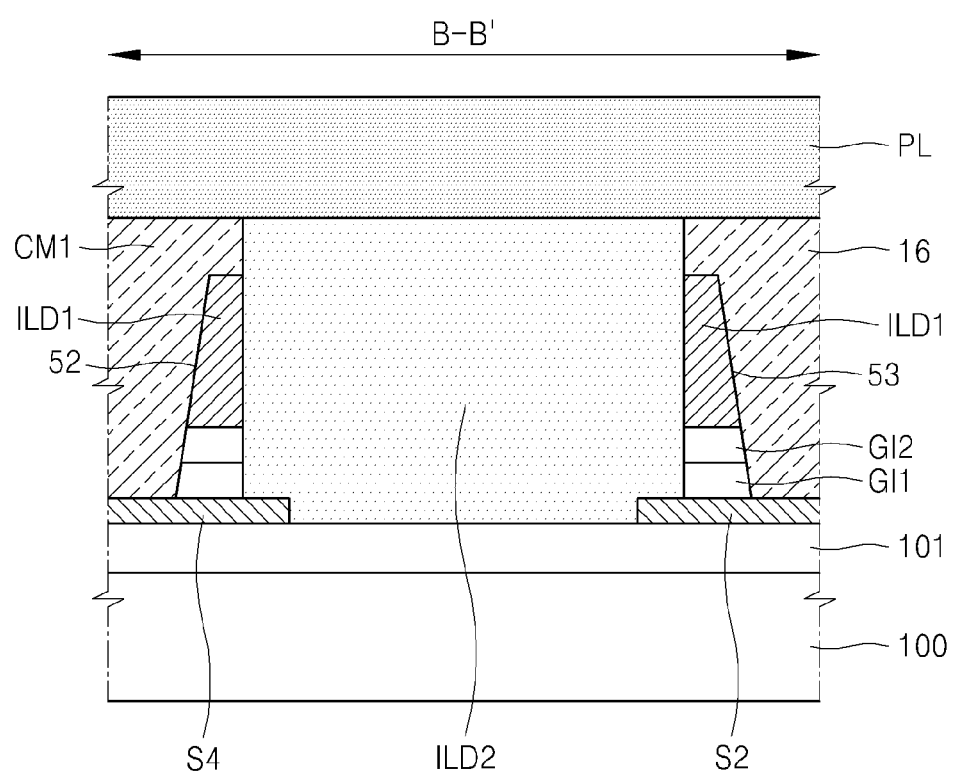
Figure 4C:
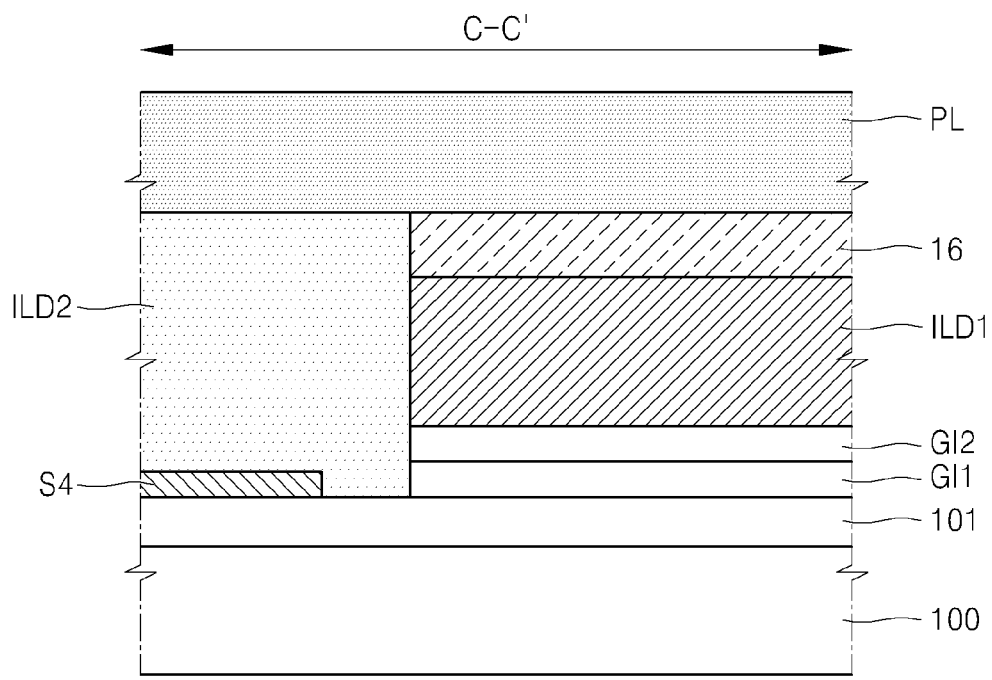

FIGS. 4A to 4C are cross-sectional views respectively taken along lines A-A', B-B', and C-C' of FIG. 3. FIGS. 4A to 4C illustrate the relationship between adjacent lines and the data line 16.

Among elements in cross-sections taken along lines A-A', B-B', and C-C', such as lines, electrodes, and semiconductor layers, elements that have little relation to the driving TFT T1, the storage capacitor Cst, etc. are omitted in FIGS. 4A to 4C in order to clarify the features of the embodiments. Therefore, the illustrations in FIGS. 4A to 4C may be different from actual cross-sectional views taken along lines A-A', B-B', and C-C' of FIG. 3.

Referring to FIGS. 4A to 4C, each pixel 1 includes a first line and a second line that are separated and formed on the same layer. A first insulating layer ILD1 is formed in an area under the first and second lines, which corresponds to at least one of the first and second lines. A second insulating layer ILD2, having a lower permittivity than that of the first insulating layer ILD1, is formed in an area between the first and second lines. The first and second insulating layers ILD1 and ILD2 function as an interlayer insulating layer that covers the TFTs T1 to T7.

Although the first line corresponds to the data line 16 and the second line corresponds to the first contact metal CM1 in FIGS. 4A to 4C, the described technology is not limited thereto.

Referring to FIG. 4A, the data line 16 that transmits the data signal Dm is formed on the driving TFT T1 and the storage capacitor Cst, with the first insulating layer ILD1 interposed therebetween. The first contact metal CM1 is formed on the same layer as the data line 16 and is connected to the driving gate electrode G1 and the first electrode C1 of the storage capacitor Cst via the first contact hole 51. As described above with reference to FIG. 3, the first contact metal CM1 connects the compensation TFT T3 and the first initialization TFT T4 to the driving TFT T1.

In order to form an OLED display 1000 with a high resolution, a line for transmitting a signal to each pixel 1 and a connection line for connecting the TFTs T1 to T7 are formed near each other. When the above-described lines are formed near each other, signal interference may occur between the above-described lines. The signal interference may be dependent on the permittivity of an insulating layer provided between the above-described lines.

According to some embodiments, the second insulating layer ILD2 having a lower permittivity than that of the first insulating layer ILD1 is formed between the lines to reduce the signal interference that occurs between the lines.

Referring to FIG. 4A, the first insulating layer ILD1 is formed below the data line 16. The first insulating layer ILD1 insulates the data line 16 from the storage capacitor Cst. The data line 16 overlaps at least a portion of the driving TFT T1 with the first insulating layer ILD1 interposed therebetween. Also, the data line 16 overlaps at least a portion of the storage capacitor Cst with the first insulating layer ILD1 interposed therebetween.

The first insulating layer ILD1 is also partially formed below the first contact metal CM1. The first contact hole 51 is filled by the first contact metal CM1 and thus the first insulating layer ILD1 is connected to the driving gate electrode G1 and the first electrode C1 of the storage capacitor Cst.

The second insulating layer ILD2 is formed between the data line 16 and the first contact metal CM1 that is filled in the first contact hole 51. Since the second insulating layer ILD2 is formed of a material having a relatively low permittivity, the second insulating layer ILD2 reduces the signal interference between the data line 16 and the first contact metal CM1.

Referring to FIG. 4B, the data line 16 is connected to the switching source electrode S2 via the third contact hole 53. The first contact metal CM1 is connected to the first initialization source electrode S4 via the second contact hole 52. The switching source electrode S2 and the first initialization source electrode S4 are formed by doping a semiconductor layer with impurities.

The second insulating layer ILD2 is formed between the data line 16 and the first contact metal CM1 that is filled in the second contact hole 52. Since the second insulating layer ILD2 is formed of a material having a relatively low permittivity, the second insulating layer ILD2 reduces the signal interference between the data line 16 and the first contact metal CM1.

Referring to FIG. 4C, the first insulating layer ILD1 is formed below of the data line 16. A substrate 100, a first gate insulating layer GB, and a second gate insulating layer GI2 are additionally formed under the first insulating layer ILD1. The first initialization source electrode S4, which is separate from the data line 16, is formed on the substrate 100. The second insulating layer ILD2 is formed on the first initialization source electrode S4 and between the first initialization source electrode S4 and the data line 16. Since the second insulating layer ILD2 is formed of a material having a relatively low permittivity, the second insulating layer ILD2 reduces the signal interference between the data line 16 and the first initialization source electrode S4.

The first insulating layer ILD1 is formed of an inorganic material or an organic material. In some embodiments, the first insulating layer ILD1 is formed of an inorganic material, for example, metal oxide or metal nitride, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In some embodiments, the first insulating layer ILD1 is formed of a material having a dielectric constant between about 4 and about 7. The first insulating layer ILD1 insulates the storage capacitor Cst from the data line 16.

The second insulating layer ILD2 is formed of a material having a lower permittivity than that of a material used to form the first insulating layer ILD1. In some embodiments, the second insulating layer ILD2 is formed of an organic material, for example, at least one of the following: polyacrylate resin, epoxy resin, phenolic resin, polyamide resin, polyimide resin, unsaturated polyester resin, polyphenylene ether resin, polyphenylene sulfide resin, and benzocyclobutene (BCB). In some embodiments, the second insulating layer ILD2 is formed of a material having a dielectric constant between about 2 and about 4. In some embodiments, the second insulating layer ILD2 is formed by using the same material as a planarization layer PL that will be described below. The second insulating layer ILD2 blocks signal interference between the lines.

The planarization layer PL is formed on the entire surface of the substrate 100 to cover the data line 16. An OLED (not shown), which includes an anode electrode, an intermediate layer including an organic emission layer (EML), and a cathode electrode, is formed on the planarization layer PL. The planarization layer PL is formed of an insulating material. For example, the planarization layer PL may be formed as a single layer or a plurality of layers formed of an inorganic material, an organic material, or a combination thereof, by using various deposition methods. In some embodiments, the planarization layer PL is formed of at least one of the following: polyacrylate resin, epoxy resin, phenolic resin, polyamide resin, polyimide resin, unsaturated polyester resin, polyphenylene ether resin, polyphenylene sulfide resin, and BCB. In some embodiments, the planarization layer PL is formed of the same material as the second insulating layer ILD2.

Although FIGS. 4A and 4C illustrate an embodiment where the second insulating layer ILD2 is formed between the data line 16 and the first contact metal CM1, the described technology is not limited thereto. The second insulating layer ILD2 can be formed between the data line 16 and the driving voltage line 26 or between the data line 16 and the second contact metal CM2.

In some embodiments, the second insulating layer ILD2 is formed according to the process described below.

First, the TFTs T1 to T7 and the storage capacitor Cst are formed on the substrate 100 and the first insulating layer ILD1 is formed on the entire surface of the substrate 100.

Next, the first to seventh contact holes 51 to 57 are formed, and then, the first contact metal CM1, the second contact metal CM2, the data line 16, and the driving voltage line 26 are formed.

Next, an area of the first insulating layer ILD1 that is to be filled by the second insulating layer ILD2 is etched by using a dry etching method, a wet etching method, or a combination thereof. In some embodiments, the dry etching method is used.

The area to be filled by the second insulating layer ILD2 is an area where gaps between the lines are relatively small or an area where signal interference can occur between the lines. The area to be filled by the second insulating layer ILD2 can be selected from only a portion of the pixel 1. However, the area to be filled by the second insulating layer ILD2 is not limited thereto. The area to be filled by the second insulating layer ILD2 can selected as all areas between lines formed at the same layer as the data line 16, such as the first contact metal CM1, the second contact metal CM2, and the driving voltage line 26.

Next, the second insulating layer ILD2 is filled in the etched area. When the second insulating layer ILD2 is formed by using the same material as the planarization layer PL, the second insulating layer ILD2 and the planarization layer PL can be formed simultaneously.

Hereinafter, the elements and the features of some of the embodiments will be described in more detail with reference to FIG. 5.

Figure 5:
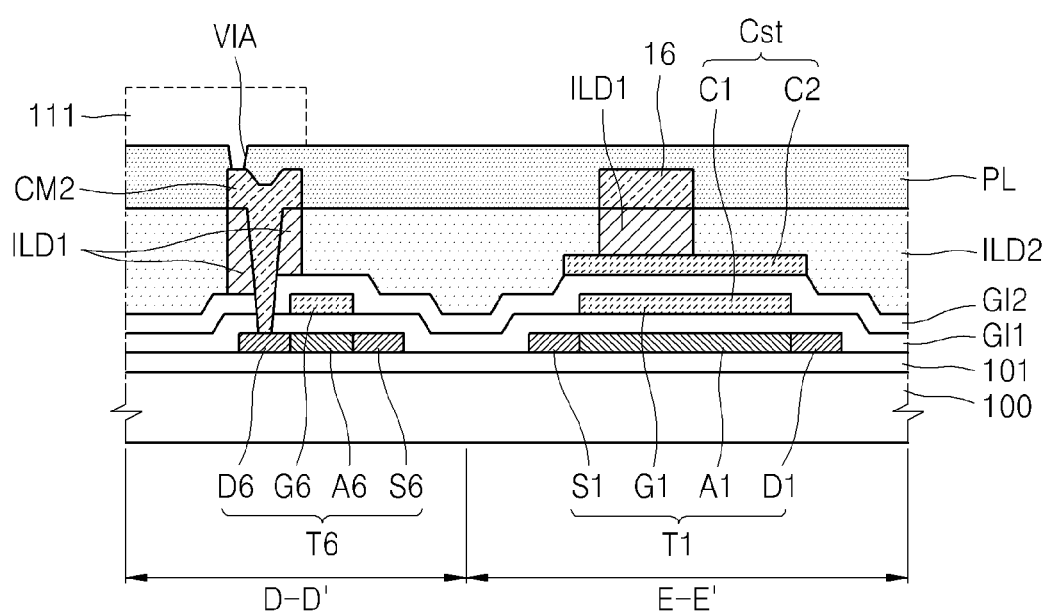
FIG. 5 is a cross-sectional view taken along lines D-D' and E-E' of FIG. 3.

FIG. 5 is a cross-sectional view taken along lines D-D' and E-E' of FIG. 3. FIG. 5 illustrates the driving TFT T1, the second emission control TFT T6 and the storage capacitor Cst.

Elements in cross-sections taken along lines D-D' and E-E', such as lines, electrodes, semiconductor layers, elements that have little relation to the driving TFT T1, the second emission control TFT T6, and the storage capacitor Cst are omitted in FIG. 5 in order to clarify the features of the embodiments. Therefore, the illustrations in FIG. 5 may be different from an actual cross-sectional view taken along lines D-D' and E-E' of FIG. 3.

Referring to FIG. 5, a buffer layer 101 is formed on the substrate 100. The buffer layer 101 functions as a barrier layer and/or a blocking layer for preventing impurity ions from spreading, blocking the penetration of moisture or external air, and planarizing surfaces.

The driving semiconductor layer A1 of the driving TFT T1 and the second emission control semiconductor layer A6 of the second emission control TFT T6 are formed on the buffer layer 101. In some embodiments, the driving semiconductor layer A1 and the second emission control semiconductor layer A6 are formed of polysilicon, include a channel area that is not doped with impurities, and include a source area and a drain area that are respectively formed on both sides of the channel area and are doped with impurities. In these embodiments, the impurities may differ based on the type of the TFT and may be N-type impurities or P-type impurities. Although not illustrated, the switching semiconductor layer A2 of the switching TFT T2, the compensation semiconductor layer A3 of the compensation TFT T3, the first initialization semiconductor layer A4 of the first initialization TFT T4, the second initialization semiconductor layer A7 of the second initialization TFT T7, and the first emission control semiconductor layer A5 of the first emission control TFT T5 may also be connected to the driving semiconductor layer A1 and the second emission control semiconductor layer A6 and thus be simultaneously formed.

The first gate insulating layer GI1 is formed on the entire surface of the substrate 100 such that the semiconductor layers (A1 to A7) are covered. The first gate insulating layer GI1 may be a single layer or a plurality of layers formed of an inorganic material such as silicon oxide or silicon nitride. The first gate insulating layer GI1 insulates the semiconductor layers (A1 to A7), from the gate electrodes (G1 to G7). According to an embodiment, the first gate insulating layer GI1 is thicker than the second gate insulating layer GI2 that will be described below. The first gate insulating layer GI1 insulates the semiconductor layers (A1 to A7) from the gate electrodes (G1 to G7) of the driving TFT T1, the switching TFT T2, the compensation TFT T3, the first and second initialization TFTs T4 and T7, and the first and second emission control TFTs T5 and T6. When the first gate insulating layer GI1 is formed to be relatively thick as described above, the parasitic capacitance between the semiconductor layers and the respective gate electrodes can be reduced, and thus, stains may be reduced on images displayed by the OLED display 1000. In particular, in the driving TFT T1, the parasitic capacitance between the driving semiconductor layer A1 and the driving gate electrode G1 is reduced, and thus, the gate voltage, which is applied to driving gate electrode G1, has a relatively wide driving range. Accordingly, the magnitude of the gate voltage can be changed such that light emitted from the OLED has more varied gray scales.

The second emission control gate electrode G6 of the second emission control TFT T6, the driving gate electrode G1 of the driving TFT T1, and the first electrode C1 of the storage capacitor Cst are formed on the first gate insulating layer GI1.

Also, although not illustrated, the switching gate electrode G2 of the switching TFT T2, the compensation gate electrode G3 of the compensation TFT T3, the first initialization gate electrode G4 of the first initialization TFT T4, the second initialization gate electrode G7 of the second initialization TFT T7, and the first emission control gate electrode G5 of the first emission control TFT T5 are simultaneously formed with the second emission control gate electrode G6, the driving gate electrode G1, and the first electrode C1. Hereinafter, the driving gate electrode G1, the switching gate electrode G2, the compensation gate electrode G3, the first and second initialization gate electrodes G4 and G7, the first and second emission control gate electrodes G5 and G6, and the first electrode C1 are formed of a first gate line material, and are referred to as a "first gate electrode."

The switching gate electrode G2, the compensation gate electrode G3, the first and second initialization gate electrodes G4 and G7, and the first and second emission control gate electrodes G5 and G6 are defined as areas where the first to third scan lines 14, 24, and 34 and the emission control line 15 overlap the semiconductor layers (A1 to A7). Therefore, the process of forming the switching gate electrode G2, the compensation gate electrode G3, the first and second initialization gate electrodes G4 and G7, and the first and second emission control gate electrodes G5 and G6 corresponds to the process of forming the first to third scan lines 14, 24, and 34 and the emission control line 15. The driving gate electrode G1 and the first electrode C1 are integrally formed. The first gate line material may include at least one of the following metals: aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

According to an embodiment, the storage capacitor Cst overlaps the driving TFT T1. In embodiments where the driving gate electrode G1 and the first electrode C1 are integrally formed, the storage capacitor Cst overlaps the driving TFT T1. Since the storage capacitor Cst overlaps the driving TFT T1, a sufficient storage capacity of the storage capacitor Cst can be achieved.

The second gate insulating layer GI2 is formed on the entire surface of the substrate 100 such that the first gate electrode is covered. The second gate insulating layer GI2 may be a single layer or a plurality of layers formed of an inorganic material such as silicon oxide or silicon nitride. The second gate insulating layer GI2 insulates the first gate electrode from a second gate electrode that will be described below. Also, the second gate insulating layer GI2 functions as a dielectric layer of the storage capacitor Cst. In order to increase the storage capacity of the storage capacitor Cst, the second gate insulating layer GI2 may be formed to be thinner than the first gate insulating layer GI1.

The second electrode C2 of the storage capacitor Cst is formed on the second gate insulating layer GI2 such that the second electrode C2 overlaps the first electrode C1. Also, the second electrode C2 includes the opening OP that exposes a portion of the first electrode C1. The first electrode C1 is connected to the compensation TFT T3 and the first initialization TFT T4 via the first contact hole 51. The second electrode C2 is formed of a second gate line material, and hereinafter, is referred to as the "second gate electrode." Similar to the first gate line material, the second gate line material may also include at least one of the following metals: Al, Pt, Pd, Ag, Mg, Au, Ni, Nd, Ir, Cr, Li, Ca, Mo, Ti, W, and Cu.

The first and second insulating layers ILD1 and ILD2 are formed on the entire surface of the substrate 100 such that the second electrode C2 of the storage capacitor Cst is covered. As described with reference to FIGS. 4A to 4C, lines such as the data line 16, the driving voltage line 26, the first contact metal CM1, and the second contact metal CM2 are formed on the first insulating layer ILD1. In some embodiments, the second insulating layer ILD2 is formed in areas between the above-described lines. In other words, the second insulating layer ILD2 is formed between the first insulating layers ILD1.

The planarization layer PL is formed on the entire surface of the substrate 100 such that the lines such as the data line 16, the driving voltage line 26, the first contact metal CM1, and the second contact metal CM2 are covered. An anode electrode 111 is formed on the planarization layer PL. The anode electrode 111 is connected to the second contact metal CM2 formed in the fifth contact hole 55 via the via hole VIA, and thus is connected to the second emission control drain electrode D6 and the second initialization source electrode S7.

Although not illustrated in FIG. 3 the anode electrode 111 of the OLED is illustrated in FIG. 5 for convenience of description. The OLED includes the anode electrode 111 and a cathode electrode (not shown) opposite to the anode electrode 111. An intermediate layer (not shown) including an organic EML is provided between the anode electrode 111 and the cathode electrode.

The intermediate layer can be formed of a small molecular weight organic material or a polymer organic material. When a small molecular weight organic material is used, the intermediate layer includes an organic EML, and may further include at least one of the following: a hole injection layer (HIL), a hole transport layer (HTL), an electron transport layer (ETL), and an electron injection layer (EIL). However, the described technology is not limited thereto, and the intermediate layer may include the organic EML and further include other various functional layers. The small molecular organic material may be formed by using a vacuum deposition method. In some embodiments, when the intermediate layer is formed of a polymer organic material, only an HTL is included in a direction of the anode electrode 111 with respect to the organic EML. The HTL can be formed on the anode electrode 111 by using an inkjet printing method or a spin coating method.

In FIG. 5, the first and second gate insulating layers GI1 and GI2 in an area corresponding to the second insulating layer ILD2 are partially removed. In some embodiments, the removal includes etching the area to be filled by the second insulating layer ILD2.

In FIGS. 3 and 5, source and drain electrodes of the TFTs that are not connected to other lines are formed on the same layer as their corresponding semiconductor layers. That is, the source and drain electrodes of each of the TFTs can be selectively formed of polysilicon that is doped with a doping material. However, the described technology is not limited thereto. A TFT according to another embodiment includes source and drain electrodes that are respectively formed on different layers from their corresponding semiconductor layers and are connected to source and drain areas of their corresponding semiconductor layers via contact holes.

Figure 6A:
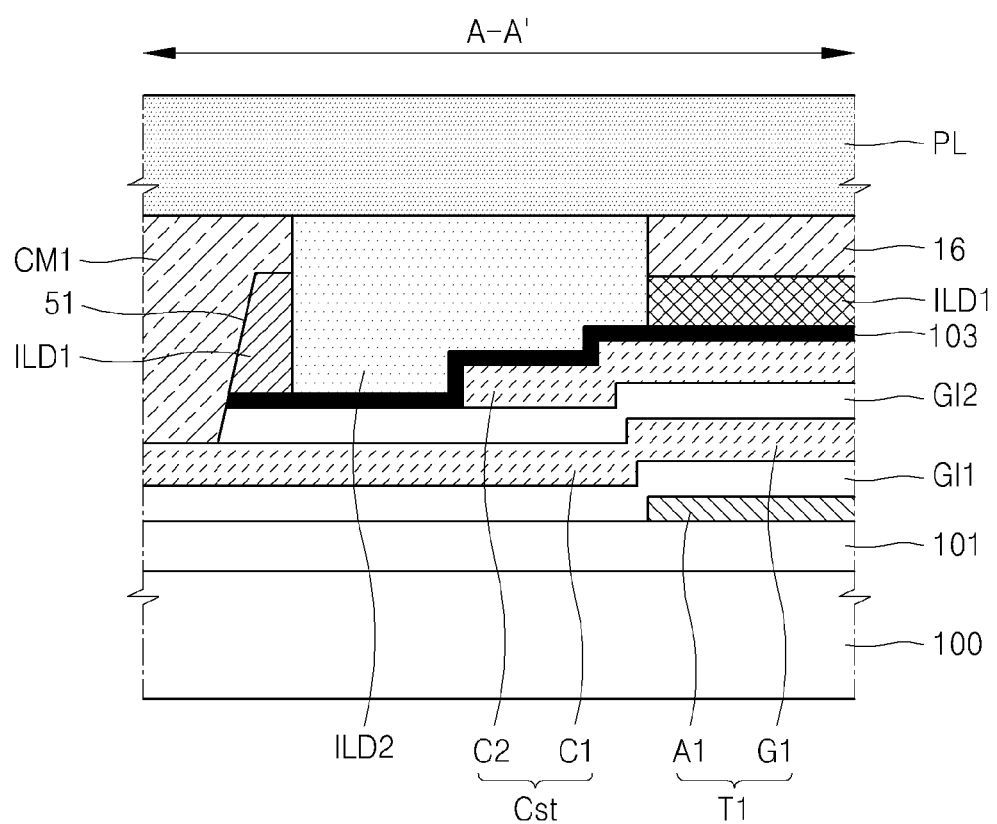
FIGS. 6A to 6C are cross-sectional views taken along lines A-A', B-B', and C-C' of FIG. 3 according to another embodiment.
Figure 6B:
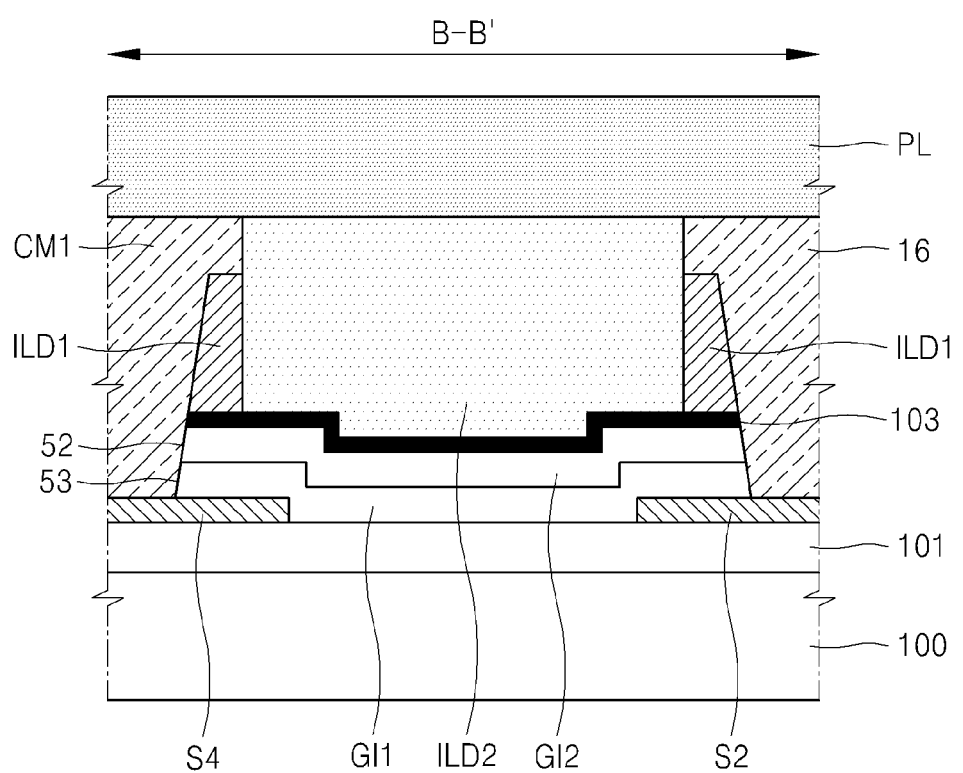
Figure 6C:
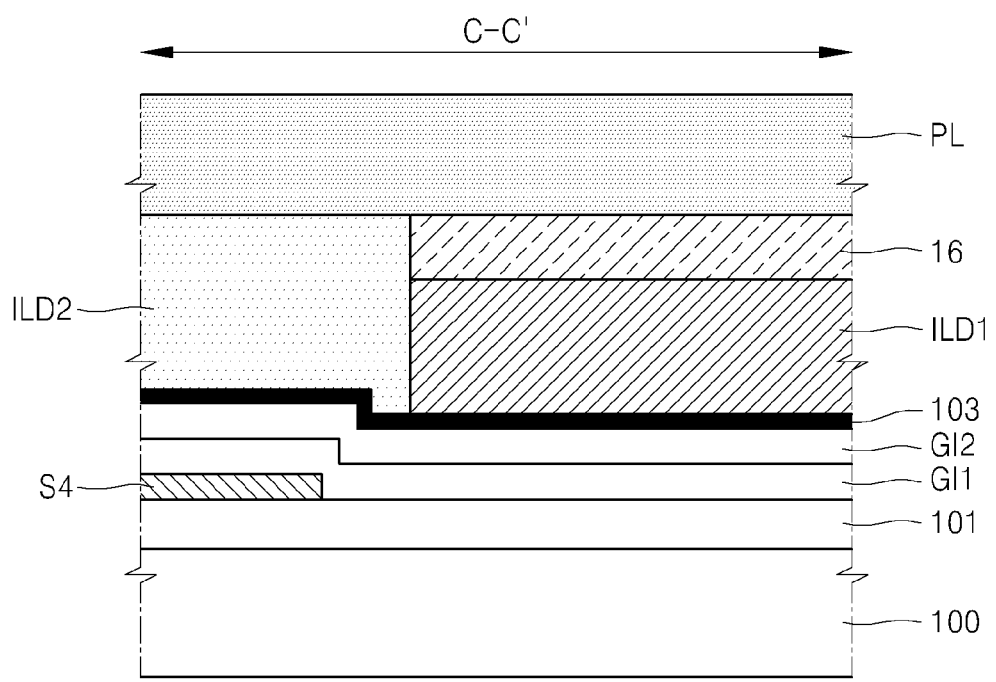

FIGS. 6A to 6C are cross-sectional views respectively taken along lines A-A', B-B', and C-C' of FIG. 3 according to another embodiment. In FIGS. 6A to 6C, reference numerals that are the same as in those of FIGS. 4A to 4C refer to the same elements and description of the same elements will be omitted for the sake of brevity.

Referring to FIGS. 6A to 6C, each pixel 1 includes first and second lines that are separated and formed on the same layer. The first insulating layer ILD1 is formed on an area under the first and second lines, which corresponds to at least one of the first and second lines. The second insulating layer ILD2 having a lower permittivity than that of the first insulating layer ILD1 is formed in an area between the first and second lines. The first and second insulating layers ILD1 and ILD2 function as an interlayer insulating layer that covers the TFTs T1 to T7 and the storage capacitor Cst. Also, in the embodiments illustrated in FIGS. 6A to 6C, an etch stop layer 103 is included under the second insulating layer ILD2 and the first insulating layer ILD1.

The etch stop layer 103 protects layers under the etch stop layer 103 when forming the second insulating layer ILD2. The material and thickness of the etch stop layer 103 can vary according to a type of process used in etching the area to be filled by the second insulating layer ILD2. In some embodiments, the etching rate of the etch stop layer 103 is different from the etching rate of the first insulating layer ILD1. For example, the etching rate of the etch stop layer 103 may be lower than the etching rate of the first insulating layer ILD1. Therefore, when the area of the first insulating layer ILD1 that is to be filled by the second insulating layer ILD2 is etched, the etch stop layer 103 is prevented from being etched. In some embodiments, a dry etching method is used in the above-described etching process and the etch stop layer 103 is formed of amorphous silicon (a-Si).

Although the first line corresponds to the data line 16 and the second line corresponds to the first contact metal CM1 in FIGS. 6A to 6C, the described technology is not limited thereto.

Referring to FIG. 6A, the data line 16 that transmits the data signal Dm is formed over the driving TFT T1 and the storage capacitor Cst, with the first insulating layer ILD1 interposed therebetween. The first contact metal CM1 is formed on the same layer as the data line 16 and is connected to the driving gate electrode G1 and the first electrode C1 of the storage capacitor Cst via the first contact hole 51. As described above with reference to FIG. 3, the first contact metal CM1 connects the compensation TFT T3 and the first initialization TFT T4 to the driving TFT T1.

The first insulating layer ILD1 is formed below the data line 16. The first insulating layer ILD1 insulates the data line 16 from the storage capacitor Cst. The data line 16 overlaps at least a portion of the driving TFT T1. The data line 16 also overlaps at least a portion of the storage capacitor Cst.

The first insulating layer ILD1 is partially formed below the first contact metal CM1. The first contact hole 51 is filled by the first contact metal CM1 and thus the first insulating layer ILD1 is connected to the driving gate electrode G1 and the first electrode C1 of the storage capacitor Cst.

The second insulating layer ILD2 is formed between the data line 16 and the first contact metal CM1 that is filled in the first contact hole 51. Since the second insulating layer ILD2 is formed of a material having a relatively low permittivity, the second insulating layer ILD2 can reduce signal interference between the data line 16 and the first contact metal CM1.

The etch stop layer 103 is formed under the second insulating layer ILD2 and between the first insulating layer ILD1 and the storage capacitor Cst. In some embodiments, the etch stop layer 103 is be formed in the first contact hole 51 and is removed during a process of forming the first contact hole 51.

Referring to FIG. 6B, the data line 16 is connected to the switching source electrode S2 via the third contact hole 53. The first contact metal CM1 is connected to the first initialization source electrode S4 via the second contact hole 52. The switching source electrode S2 and the first initialization source electrode S4 are formed by doping a semiconductor layer with impurities.

The second insulating layer ILD2 is formed between the data line 16 and the first contact metal CM1 that is filled in the second contact hole 52. Since the second insulating layer ILD2 is formed of a material having a relatively low permittivity, the second insulating layer ILD2 can reduce signal interference between the data line 16 and the first contact metal CM1.

The etch stop layer 103 is formed under the second insulating layer ILD2 and on the second gate insulating layer GI2. Therefore, the first gate insulating layer GB, the second gate insulating layer GI2, and the second insulating layer ILD2 are sequentially formed in an area between the first contact metal CM1 and the data line 16.

Referring to FIG. 6C, the first insulating layer ILD1 is formed below the data line 16. The substrate 100, the first gate insulating layer GB, and the second gate insulating layer GI2 are also formed below the first insulating layer ILD1. The first initialization drain electrode D4, which is separate from the data line 16, is formed on the substrate 100. The second insulating layer ILD2 is formed on the first initialization source electrode S4 and between the first initialization source electrode S4 and the data line 16. Since the second insulating layer ILD2 is formed of a material having a relatively low permittivity, the second insulating layer ILD2 can reduce signal interference between the data line 16 and the first initialization source electrode S4.

The etch stop layer 103 is formed under the first and second insulating layers ILD1 and ILD2. The first and second gate insulating layers GI1 and GI2 are also formed under the etch stop layer 103.

Although the etch stop layer 103 is illustrated as being formed under the second insulating layer ILD2 in FIGS. 6A to 6C, the location of the etch stop layer 103 is not limited thereto. For example, the etch stop layer 103 may be formed under the second gate insulating layer GI2 or in other areas.

As described above, according to at least one embodiment, signal interference is reduced in an OLED display.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the inventive technology have been described with reference to the figures, it will be understood by those of ordinary skill in the art that various changes in form and details may be made therein without departing from the spirit and scope of the invention as defined by the following claims.

What is claimed is:

1. An organic light-emitting diode (OLED) display, comprising:
a plurality of pixels, wherein each of the pixels comprises:
a first insulating layer;
a first signal line configured to transmit a first signal to the pixel;
a second signal line spaced apart from the first signal line and formed on the same layer as the first signal line, wherein the second signal line is configured to transmit a second signal to the pixel and wherein at least a portion of the first and second signal lines is formed over the first insulating layer; and
a second insulating layer interposed between the first and second signal lines, wherein the second insulating layer has a lower permittivity than the first insulating layer,
wherein the second insulating layer is interposed between portions of the first insulating layer.

2. The OLED display of claim 1, wherein the first insulating layer is formed of an inorganic material and wherein the second insulating layer is formed of an organic material.

3. The OLED display of claim 1, wherein each pixel further comprises a planarization layer covering the first and second signal lines and formed of the same material as the second insulating layer.

4. The OLED display of claim 1, wherein each pixel further comprises an etch stop layer formed below the second insulating layer and wherein the etch stop layer has an etching rate that is different from that of the first insulating layer.

5. The OLED display of claim 1, further comprising a substrate, wherein each pixel further comprises a driving thin film transistor (TFT) formed over the substrate, wherein the first signal line is a data line configured to transmit a data signal to the pixel, and wherein the second signal line is a contact metal electrically connected to the driving TFT via a contact hole.

6. The OLED display of claim 5, wherein the first signal line overlaps at least a portion of the driving TFT and wherein the first insulating layer is interposed between the first signal line and the driving TFT.

7. The OLED display of claim 5, wherein each pixel further comprises a storage capacitor including i) a first electrode connected to a driving gate electrode of the driving TFT and ii) a second electrode formed over and insulated from the first electrode and wherein the driving gate electrode and the first electrode are integrally formed on the same layer.

8. The OLED display of claim 7, wherein each of the driving TFTs comprises a driving semiconductor layer formed below the driving gate electrode and insulated from the driving gate electrode by a first gate insulating layer.

9. The OLED display of claim 8, wherein each of the pixels further comprises an emission control TFT electrically connected between the driving TFT and an OLED, wherein the emission control TFT comprises i) an emission control semiconductor layer formed on the same layer as the driving semiconductor layer and ii) an emission control gate electrode insulated from the emission control semiconductor layer by the first gate insulating layer.

10. The OLED display of claim 9, wherein the OLED comprises i) an anode electrode, ii) a cathode electrode opposing the anode electrode, and iii) an organic emission layer interposed between the anode and cathode electrodes.

11. The OLED display of claim 7, wherein each of the storage capacitors comprises a second gate insulating layer interposed between the first and second electrodes.

12. The OLED display of claim 7, wherein the second electrode of each of the storage capacitors is electrically connected to a driving voltage line configured to transmit a driving voltage.

13. An organic light-emitting diode (OLED) display, comprising:
a substrate; and
a plurality of pixels, wherein each of the pixels comprises:
a driving thin film transistor (TFT) formed over the substrate;
an interlayer insulating layer covering the driving TFT;
a contact metal formed over the interlayer insulating layer and electrically connected to the driving TFT via a contact hole; and
a first signal line formed over the interlayer insulating layer and overlapping at least a portion of the driving TFT,
wherein the interlayer insulating layer comprises i) a first insulating layer formed below the contact metal and the first signal line and ii) a second insulating layer interposed between the contact metal and the first signal line, wherein the second insulating layer has a lower permittivity than the first insulating layer,
wherein the second insulating layer is interposed between portions of the first insulating layer.

14. The OLED display of claim 13, wherein the first insulating layer is formed of an inorganic material and wherein the second insulating layer is formed of an organic material.

15. The OLED display of claim 13, wherein each pixel further comprises a planarization layer covering the contact metal and the first signal line and formed of the same material as the second insulating layer.

16. The OLED display of claim 13, wherein each pixel further comprises an etch stop layer formed below the second insulating layer and wherein the etch stop layer has an etching rate that is different from that of the first insulating layer.

17. The OLED display of claim 13, wherein each pixel further comprises a storage capacitor including i) a first electrode connected to a driving gate electrode of the driving TFT and ii) a second electrode formed over and insulated from the first electrode and wherein the driving gate electrode and the first electrode are integrally formed on the same layer.

18. The OLED display of claim 17, wherein each of the driving TFTs comprises a driving semiconductor layer formed below the driving gate electrode and insulated from the driving gate electrode by a first gate insulating layer, wherein the storage capacitor comprises a second gate insulating layer interposed between the first and second electrodes, and wherein the thickness of the first gate insulating layer is greater than the thickness of the second gate insulating layer.

* * * * *